United States Patent [19]

Canter

[11] Patent Number: 5,053,695
[45] Date of Patent: Oct. 1, 1991

[54] DC CURRENT MONITOR
[75] Inventor: Stanley Canter, Phoenix, Ariz.
[73] Assignee: Space Systems/Loral, Inc., Palo Alto, Calif.
[21] Appl. No.: 490,866
[22] Filed: Mar. 9, 1990
[51] Int. Cl.$^5$ .......................... G01R 1/22; G01R 33/00
[52] U.S. Cl. .................................. 324/117 R; 324/126; 324/127
[58] Field of Search ............. 324/244, 126, 127, 99 R, 324/99 D, 117 R, 117 H; 330/8; 307/314

[56] References Cited

U.S. PATENT DOCUMENTS

| | | | |
|---|---|---|---|
| 3,699,442 | 10/1972 | Riley | 324/117 R |
| 3,768,011 | 10/1973 | Swain | 324/117 R |
| 4,276,510 | 6/1981 | Tompkins et al. | 324/127 |
| 4,298,838 | 11/1981 | Akamatsu et al. | 324/117 R |
| 4,374,359 | 2/1983 | Missout | 324/126 |
| 4,454,553 | 6/1984 | Iwasaki | 324/117 R |
| 4,682,100 | 7/1987 | Hagelin | 324/117 R |
| 4,682,106 | 7/1987 | Vatis et al. | 324/307 |
| 4,899,103 | 2/1990 | Katzenstein | 324/117 R |
| 4,914,383 | 4/1990 | Wilkerson | 324/127 |

Primary Examiner—Kenneth Wieder
Assistant Examiner—Vinh P. Nguyen
Attorney, Agent, or Firm—Rosenblum, Parish & Bacigalupi

[57] ABSTRACT

A non-intrusive DC current monitor is presented which emulates the theoretical operation of an AC transformer. A conductor, carrying the current to be measured, acts as the primary of a DC current transformer. This current is passed through the center of a secondary coil, and core positioned thereabout, and produces a magnetic flux which induces a current in the secondary proportional to the current flowing in the primary. Means are provided to periodically "reset" the transformer core such that the measurement inaccuracies associated with core saturation are obviated. A reset current is caused to periodically flow through the secondary coil which produces a magnetic flux oppositely polarized to the flux created by the current in the primary, thus allowing ongoing measurements to be made.

17 Claims, 3 Drawing Sheets

DC CURRENT MONITOR

This invention is a subject invention under NASA contract NAS3-25082, and, as such, the U.S. Government has rights therein.

BACKGROUND OF THE INVENTION

1. Field of the Invention

The present invention relates generally to devices used to measure DC currents, and, more specifically, it relates to an improved non-intrusive DC current monitor with a substantially improved accuracy, sampling rate and reduction in noise.

2. Brief Description of the Prior Art

It is often necessary to measure the flow of electrical current within an electronic system. The most common method of measurement is to pass a current through a resistor and measure the resulting voltage drop thereacross, the voltage drop being representative of the passing current. As is generally known, the resistor used in making the measurement adds to the loading on the circuit through which the DC current must pass. This increased load can cause a substantial power loss, especially in high power systems where there is significant DC current flow.

Alternative current measuring devices are available which permit potential free measurement of direct current. An example of this type of device is the Hall-effect sensor which is a non-intrusive current converter. A Hall-type of device senses the magnetic field of a current and converts it into electrical signals in proportion to field intensity. The field intensity, is representative of the magnitude of the current being measured. However, these types of devices suffer from fundamental limitations in their stability and accuracy which may make them ineffective for use in precision systems. For example, these current converters have a zero-offset current which exhibits a characteristic drift behavior. This is caused by factors such as aging or temperature changes. Although this zero drift is small, significant distortions in measurements often result.

Another type of DC current measuring device, an example of which is disclosed in U.S. Pat. No. 4,682,100, makes use of a transformer-like device to measure the current in a non-intrusive fashion. The DC current to be measured is supplied through a primary winding, which causes a magnetic flux in the transformer core. This flux is compensated by a current supplied to a secondary winding until the flux in the core is equalized at a zero net-flux state. This compensating current through the secondary winding constitutes a copy of the current in the primary winding transformed over the transforming ratio of the transformer. Devices using similar technology are disclosed in U.S. Pat. No. 3,368,011, U.S. Pat. No. 4,454,553, and in the publication Powercon II, page I-1, April, 1984.

None of those prior art devices, however, are capable of providing reliable and accurate data at low values of bus current, thus limiting their range of effectiveness. Additionally, many of these devices induce noise into the bus when using compensating current to make a bus current measurement. Another limitation is that none of those prior art devices provide an extension to measurement of bilateral current flow.

SUMMARY OF THE PRESENT INVENTION

Briefly, the apparatus of the present invention employs a DC current transforming element which emulates the theoretical operation of an AC transformer, thus extending the usefulness of the AC current transformer such that it can be used in measuring true DC current. In the preferred embodiment, a wire, or bus, carrying the load current to be measured, acts as the primary of the DC current transformer. This primary carries the load current through the center of a secondary coil, and core positioned thereabout, and produces a magnetic flux which induces a current in the secondary proportional to the current flowing in the primary. This induced secondary current is then measured and is representative of the load current. In order to avoid the measurement inaccuracies caused by core saturation, means are provided to periodically "reset" the transformer core by periodically producing a reset current flow through the secondary coil. This reset current produces a magnetic flux oppositely polarized to the flux created by the load current, thus reducing to zero the net magnetic flux, averaged over a complete measurement-reset cycle, in the transformer "core". This allows ongoing measurements to be made without the difficulties associated with transformer core saturation.

DETAILED DESCRIPTION OF THE PREFERRED EMBODIMENT

Figure 1:
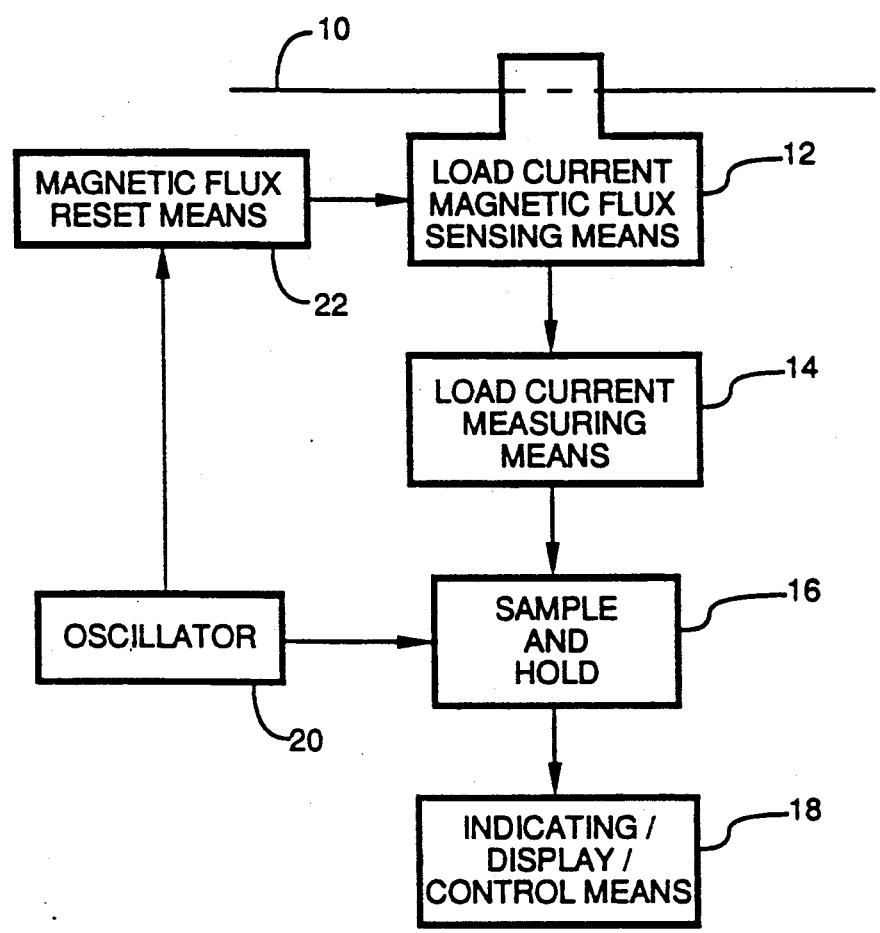
FIG. 1 is a block diagram of the preferred embodiment of the present invention, illustrating, in general, the components utilized in measuring the DC load current and in resetting the magnetic flux in the core.

Referring to FIG. 1, shown is a block diagram illustrating the functional components of the preferred embodiment of the present invention and their interrelationships. The load current to be measured is carried by a conduit 10 which passes through a load current magnetic flux sensing means 12. The dashed line in FIG. 1 represents the conduit 10 as passing through the sensing means 12, as opposed to being connected thereto. An output from the sensing means 12 is coupled to an input of a load current measuring means 14, an output of which is in turn connected to an input of a sample and hold circuit 16. An output from the sample and hold circuit is connected to an input of an indicating, display, or control means 18, or the like, which provides the current measurement data in a user readable format.

Also shown in FIG. 1 is an oscillator 20, one output of which is connected to an input of the sample and hold circuit 16, and another output of which is connected to an input of a magnetic flux reset means 22. An output of the magnetic flux reset means is connected to an input of the sensing means 12.

In operation, the load current traveling in conduit 10 passes through sensing means 12 and produces a magnetic flux therein. This magnetic flux induces a secondary current in the sensing means proportional to the load current passing through the conduit. The secondary current then passes through load current measuring means 14 by which a voltage measurement is made. The sample and hold circuit 16 periodically samples the measured voltage, and subsequently transmits the sampled information to display or control means 18.

It is a well known principle in electromagnetic theory that the induced EMF in a magnetic circuit is proportional to the rate at which the magnetic flux through the circuit is changing. Because the load current carried by conduit 10 is normally a relatively steady DC current, following the commencement of conduction the magnetic flux in sensing means 12 will build up and then remain at a relatively constant magnitude, until there is a substantial change in the current flow through conduit 10. Consequently, unless the core is periodically reset, the secondary current will not accurately track the primary current and unreliable measurements will be obtained.

In accordance with the present invention, the problem of saturation is obviated by periodically "resetting" the magnetic coupling mechanism using magnetic flux reset means 22. Under the control of the oscillator 20, the output of the reset means is periodically coupled to sensing means 12, causing a reset current to flow therethrough. When this occurs, the magnetic flux in the sensing means is "reset" such that the magnitude of the net flux between the sensing means and conduit passes through a zero value and subsequently reverses in polarity as compared to the magnetic flux created by the load current in conduit 10 alone. The reset means is then un-coupled from the sensing means, via control by the oscillator, at which time the load current will once again briefly induce a secondary current in the sensing means, allowing a further measurement to be made by the measuring means 14. The above-described process is repeated at a frequency corresponding to the frequency of the output signal transmitted from the oscillator to the reset means, and effectively provides for a device which can accurately monitor a DC current at a high sampling rate.

Figure 2:
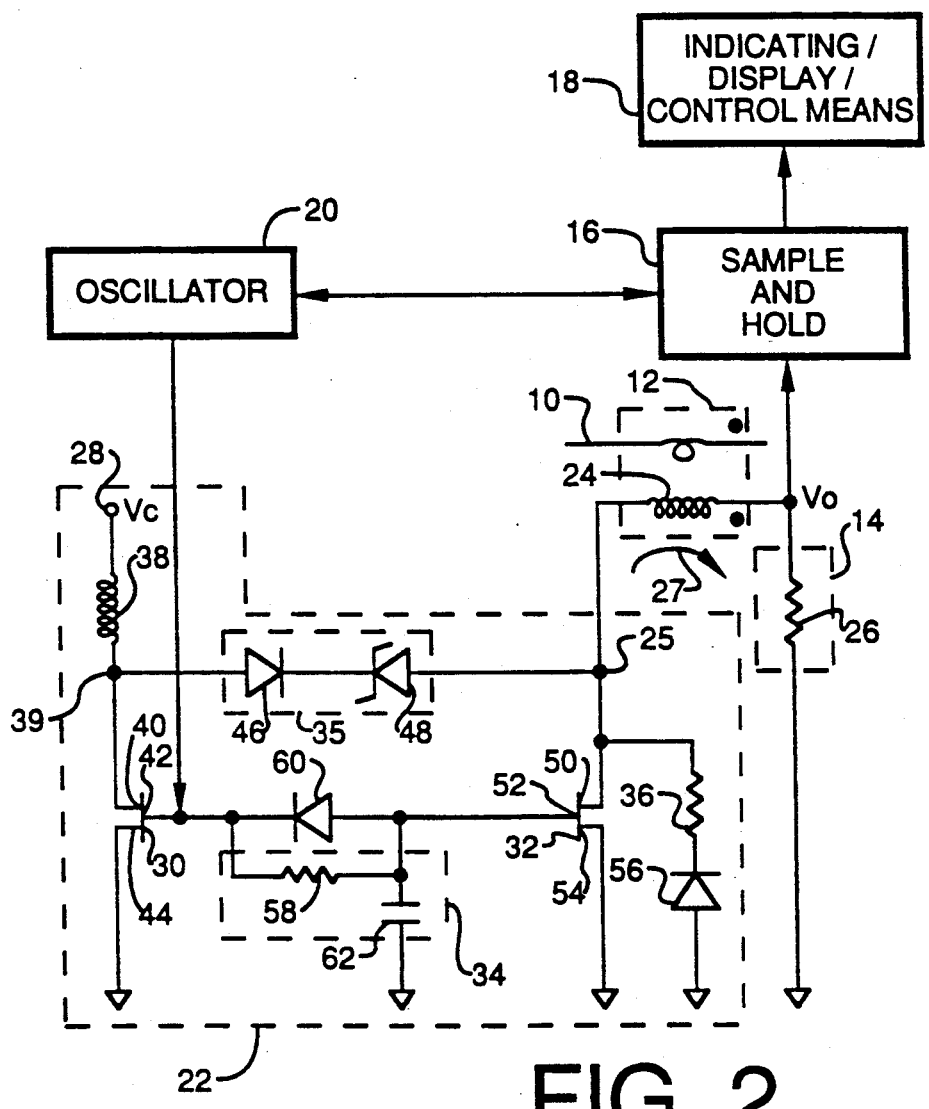
FIG. 2 is a circuit diagram illustrating in detail a preferred embodiment of the present invention depicted in FIG. 1.
Figure 4:
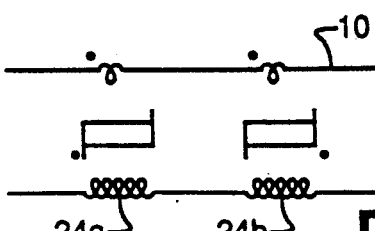
FIG. 4 illustrates an alternative sensor configuration for measuring bi-directional current flow.

Referring now to FIG. 2, a circuit diagram is shown illustrating the various functional elements of the preferred embodiment and their interconnections. Magnetic flux sensing means 12 comprises an induction coil 24 (and associated magnetic core) connected at one end to load current measuring means 14. Although the illustrated sensing means is represented by a single coil, a pair of back-to-back coils can be utilized, as shown in FIG. 4, such that bi-directional currents can be monitored using substantially the same reset circuit configuration as that depicted in FIG. 2. Coil 24 would simply be replaced by coils 24a and 24b, connected in series, as shown in FIG. 4. Each of the coils, 24a and 24b, in this embodiment has its own separate associated core. It is contempleted that a single sense winding can be utilized to cover both cores associated with coils 24a and 24b in FIG. 4, thus effectively replacing the two coil arrangement with a single coil, while still retaining the bi-directional measurement capabilities.

Refering back to FIG. 2, the load current measuring means 14 comprises a resistor 26, one end of which is connected to coil 24, and another end of which is connected to circuit ground. One input of the sample and hold 16 is connected to resistor 26, and an output from the sample and hold circuit 16 is connected to an input of indicating mean 18.

Magnetic flux reset means 22 generally comprises a voltage input terminal 28, to which suitable voltage supply $V_s$ may be connected, switching means 30 and 32, delay means 34, a current coupling circuit 35, and current dissipating means 36. In the embodiment shown in FIG. 2, switching means 30 comprises a transistor with a source 40, gate 42, and drain 44. An inductor 38 is connected between terminal 28 and the source 40 of switching means 30. Inductor 38 acts to reduce bus noise associated with circuit operation. The drain 44 of switching means 30 is connected to ground.

Switching means 32 comprises a transistor including a source 50, gate 52, and drain 54. One end of induction coil 24 is connected to the source 50, while the drain 54 is connected to ground.

The current dissipating means, in the form of a resistor 36, has one end connected to the source 50, and its other end connected through a diode 56 to ground.

The reset current coupling circuit 35 includes a diode 46 and Zener diode 48 connected in series between source 40 at node 39 and source 50 at node 25. Zener diode 48 is oppositely polarized relative to diode 46 such that current will only flow in the direction from terminal 28 through inductor 38 and circuit 35 to coil 24 when the voltage at source 40 exceeds the breakdown potential of Zener diode 48.

The gate 42 of switching means 30 and the gate 52 of switching means 32 are connected by delay means 34 which comprises a resistor 58, one end of which serves as an input to the delay means, and is connected to the gate 42 of switching means 30, and the other end of which is connected to a capacitor 62. The side of the capacitor opposite that connected to the resistor 58 is connected to ground. The output of the delay means is connected to the gate 52 of transistor 32. A diode 60 is connected between the gates 42 and 52, in parallel with the delay means 34. Diode 60 is polarized so that current flow to charge capacitor 62 must pass through resistor 58, but discharging current may be shorted therearound. This assures the synchronous turnoff of transistors 30 and 32.

One output of oscillator 20 is connected to the gate 42 of the switching means 30, and to the gate 52 of switching means 32, the latter connection being made via the delay means 34. In the preferred embodiment, the signal transmitted by oscillator 20 to the gates 42 and 52 is a series of rectangular pulses of 90% (of cycle) duration occurring at a 100 to 2000 Hz rate. The oscillator also has a corresponding output connected to an input of the sample and hold circuit 16.

Figure 3:
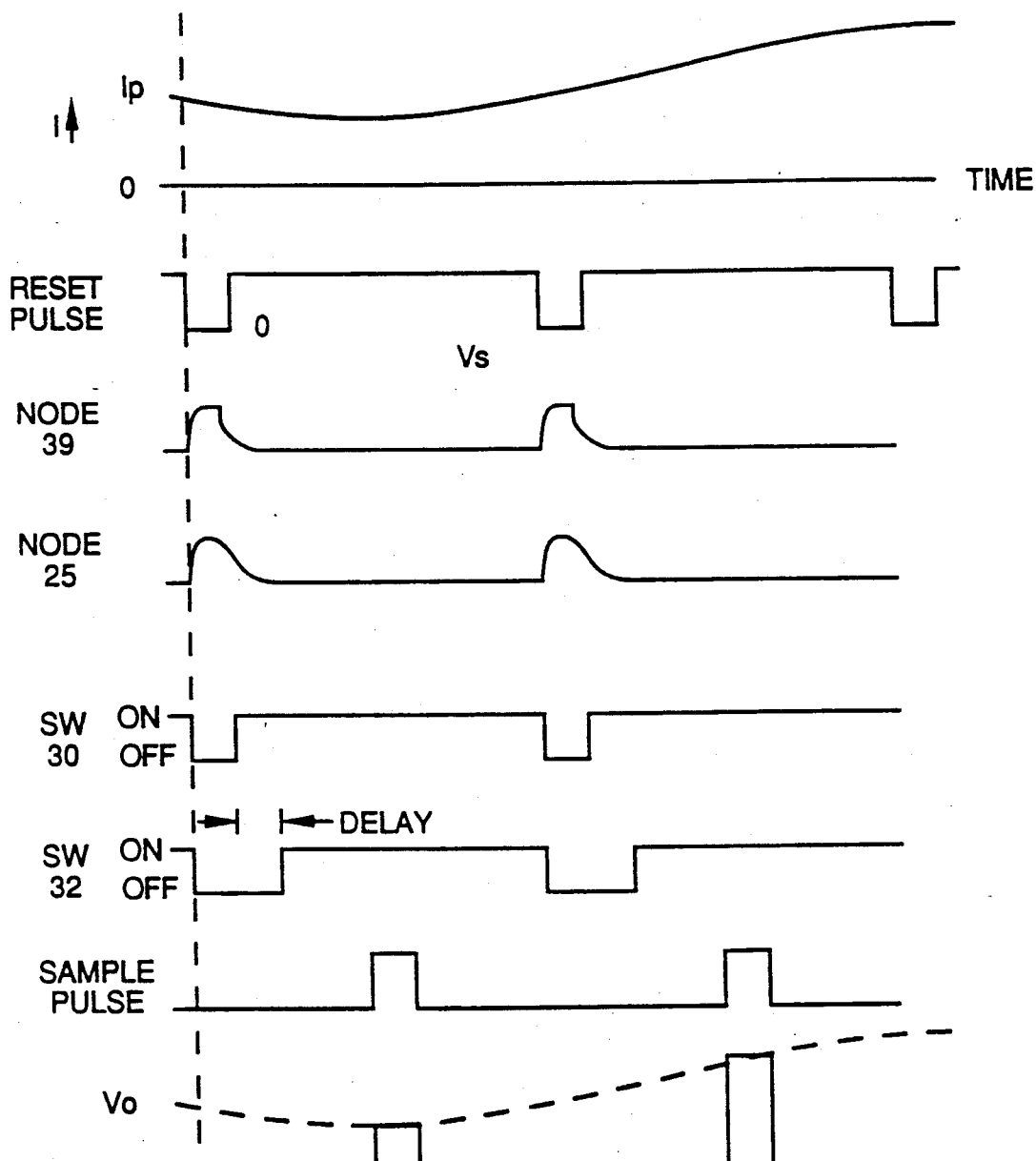
FIG. 3 is a timing diagram illustrating voltages occuring at selected points in the circuit during operation.

With no DC current flowing in conduit 10, there will be no magnetic flux generated in the sensing means 12, and no secondary current to be measured by the measuring means 14. As indicated in FIG. 3, with a slowly changing "DC" current flowing through the conduit 10, a secondary current will be induced in the induction coil 24 due to the change in magnetic flux developed in the core of the sensor by the load current. However, unless periodically reset, the core will become saturated and the secondary current will not accurately track the current to be measured.

When the output signal from the oscillator goes high, transistor 30 turns "on" and transistor 32 initially remains "off", allowing current to flow from $V_s$ through inductor 38 to ground, thereby pulling node 39 substantially to ground potential. A short time thereafter, as determined by delay circuit 34, transistor 32 is turned on and pulls node 25 to ground.

When transistor 32 is "on", secondary current induced in winding 24 by the current in conduit 10 travels in a clockwise loop, through resistor 26 to ground and then back through transistor 32 to node 25. As the secondary current flows through resistor 26, the potential difference developed thereacross may be sampled by the sample and hold circuit 16. This measurement is representative of the current flowing in conduit 10.

As indicated above, because conduit 10 carries a DC current, the flux created by this current will begin to saturate the core a short time after initialization of current flow, after which secondary current, if any, induced in the winding coil 24 will not accurately reflect the primary current. The apparatus of the present invention uses magnetic flux reset means 22 to obviate this measurement disabling effect of saturation.

When the output from the oscillator 20 goes low, switching means 30 and 32 are instantaneously turned "off", such that no current can flow therethrough from source to drain. As transistor 30 turns off, node 39 will be pulled up toward the supply and the potential barrier of the zener diode 48 will be overcome, allowing reset current to flow through coil 38, diode 46, zener diode 48, and thence through secondary coil 24 and resistor 26 to ground, flowing in the direction indicated by arrow 27 of the figure. The reset current cannot flow through transistor 32 because it is "off" at this time, nor can current flow through resistor 36 to ground, once again, because of diode 56. As the reset current flows through this clockwise loop, a magnetic flux is produced in the core of sensor 12, oppositely polarized to that produced by the load current in conduit 10. This has the effect of countering the magnetic flux produced in the core by the load current and, hence, "resets the core" such that, averaged over a complete measurement-reset cycle, there exists a zero magnitude net flux.

When the output from the oscillator once again goes high, transistor 30 is switched "on", immediately pulling node 39 to ground. At this point, voltage across the diode 48 drops below the breakdown potential necessary to permit reverse current to flow therethrough, and the supply voltage at terminal 28 is no longer effective to determine the voltage applied at node 25.

Unlike transistor 30, when the output of oscillator 20 goes high, transistor 32 is not immediately turned "on", but rather remains "off" for a period as determined by delay means 34. The signal from the oscillator cannot travel through diode 60, but rather must pass through resistor 58 and into capacitor 62. Only after the capacitor charges sufficiently to raise the voltage applied to the gate 52 of transistor 32 to its turn-on potential will transistor 32 conduct and pull node 25 to ground. The length of the delay before transistor 32 is switched "on" is determined by the RC time constant of resistor 58 and capacitor 62.

During the delay period, with transistor 32 "off", diodes 46 and 56 prevent node 25 from being immediately pulled to ground by transistor 30. However, at this juncture, resistor 36 and diode 56 come into play by providing a loop closure which enables the energy stored in the core and winding 24 to be discharged to ground. Shortly thereafter, transistor 32 will be turned on as the charge on capacitor 62 reaches gate turn-on potential. At this time, the oscillator signal is high, and both transistors are on. Because the magnetic flux linking conduit 10 and coil 24 has been reset, the flux from the DC current flowing in the conduit once again induces a secondary current in sensing means 12. Thus, measurement can once again be made of this secondary current as it flows through measuring means 14.

A second output of oscillator 20 provides timing control to the sample and hold 16 in synchronous relation with control of reset means 22 such that the measurements taken across measuring means 14 can be periodically sampled and transmitted to display means 18.

The above-described apparatus operates as a non-intrusive DC current measuring device. In the preferred embodiment, coil 24 and its associated core are slipped over an existing bus or conductor. This has a very important inherent advantage, in that it does not require that conductor 10 be broken. Furthermore, there is no additional series component to present a potential reliability hazard which must be considered in a reliability prediction.

Another benefit is device accuracy. The limits to the device's accuracy and stability appear to be only in the sample and hold circuit and its amplifier, not in the sensing, measuring, and flux resetting means. Thus, the drift problems associated with the hall effect type devices and various other types of current monitoring devices have been eliminated. Small currents can be accurately measured with the device without the high percentage error of prior art devices, thus extending the usefulness of the device to a wider range of applications. Additionally, with a configuration such as that depicted in FIG. 4, bilateral current flow can be measured, thus further extending the device's range of usefulness.

What is claimed is:

1. Apparatus for monitoring DC current comprising:
   magnetic sensing means including a magnetic core and secondary winding, said sensing means being capable of sensing a DC current flowing through a conduit and producing a secondary current in said secondary winding proportional to the sensed DC current;
   current measuring means coupled to said magnetic sensing means and operative to generate an output voltage signal proportional to the magnitude of said secondary current; and,
   reset means coupled to said sensing means and including a first switching means for periodically applying a reset current to said secondary winding and a second switching means for periodically grounding one side of said secondary winding, said reset means being operative to periodically produce a reset current in said sensing means sufficient to reverse the polarity of the magnetic flux in said core and drive said core to saturation in a reverse flux direction relative to the flux caused by said DC current such that the magnitude of current subsequently induced in said secondary winding accurately corresponds to the magnitude of current flowing in said conduit.

2. Apparatus as described in claim 1 and further comprising:
   an oscillator coupled to said reset means and operative to periodically actuate said first and second switching means.

3. Apparatus as described in claim 1 or 2 further comprising: a sample and hold circuit coupled to said measuring means for periodically sampling and storing said output voltage signal; and,
   display means operative to receive said stored voltage signal from said sample and hold circuit and to display said signal in a user readable format.

4. Apparatus as described in claim 3 wherein said oscillator is further operative to provide timing control to said sample and hold circuit in synchronous relation with said actuation of said first and second switching means.

5. Apparatus as described in claim 1 wherein said measuring means includes a resistor across which said voltage signal is produced as said secondary current flows therethrough, said voltage signal being proportional to said DC current flowing through said conduit.

6. Apparatus a described in claim 2 wherein said reset means further includes:
current dissipating means connected across said second switching means such that when said first switching means is turned "on" by said oscillator, said reset current is allowed to collapse through said current dissipating means; and,
delay means connected between said oscillator and the input to said second switching means, said delay means being operative to delay actuation of said second switching means sufficient to allow said reset current to dissipate through said dissipating means.

7. Apparatus as described in claim 6 wherein said first switching means includes a first transistor having its source connected to a voltage supply, its drain connected to circuit ground, and its gate connected to an output of said oscillator.

8. Apparatus as described in claim 7 wherein said second switching means includes a second transistor having its source connected to said sensing means, its drain connected to circuit ground, and its gate connected to said delay means.

9. Apparatus as described in claim 6 wherein said current dissipating means includes a resistor with a high value of resistance such that current passing therethrough is quickly dissipated.

10. Apparatus as described in claim 6 wherein said delay means includes a resistor and a capacitor connected between said oscillator and said second switching means, said resistor being connected in parallel with a diode, such that, when said signal from said oscillator is high, current flows through said resistor and charges said capacitor, and when said signal from said oscillator is low, said capacitor discharges through said diode whereby said first switching means and said second switching means are turned "off" substantially simultaneously.

11. A non-intrusive DC current monitor as described in claim 6 wherein said magnetic sensing means further includes an additional secondary winding coupled in back-to-back relationship to the first said secondary winding such that bi-directional DC current can be measured.

12. Apparatus as described in claim 1 wherein said sensing means further includes an additional secondary winding connected in back-to-back relationship to the first said secondary winding such that bi-directional DC current can be measured.

13. A non-intrusive DC current monitor for use in electronics instrumentation application such as measuring current in a conductor, comprising:
magnetic sensing means including a magnetic core and a secondary winding for sensing DC current flowing in said conductor, said conductor operating as a primary winding for said sensing means;
current measuring means coupled to said secondary winding for measuring secondary current induced by the current in said conductor, the magnitude of said secondary current being proportional to the magnitude of the current in said conductor;
core resetting means coupled to said secondary winding for periodical driving said core to saturation in a reverse flux direction relative to the flux direction established in said core by the current in said conductor such that continuous measurements can be made of the current in said conductor.

14. A non-intrusive DC current monitor as described in claim 13 wherein said core resetting means includes first switching means for periodically applying a reset current to said secondary winding and second switching means for periodically coupling one side of said secondary winding to ground, said resetting means being operative to reverse the polarity of the magnetic flux in said core relative to the magnetic flux polarity in said core as established by the current in said conductor.

15. A non-intrusive DC current monitor as described in claim 14 further comprising:
actuating means coupled to said core resetting means for periodically actuating said first switching means and said second switching means;
current dissipating means coupled across said second switching means for dissipating said reset current when said first switching means is closed; and
delay means coupled between said actuating means and said second switching means for delaying the closing of said second switching means such that said reset current has sufficient time to dissipate through said dissipating means.

16. A non-intrusive DC current monitor as described in claim 15 wherein said magnetic sensing means further includes an additional secondary winding coupled in back-to-back relationship to the first said secondary winding such that bi-directional DC current can be measured.

17. A non-intrusive DC current monitor as described in claim 13 wherein said magnetic sensing means further includes an additional secondary winding coupled in back-to-back relationship to the first said secondary winding such that bi-directional DC current can be measured.

* * * * *